July 17, 1962 M. M. ATALLA ETAL 3,045,129

SEMICONDUCTOR TUNNEL DEVICE

Filed Dec. 8, 1960

INVENTORS: M. M. ATALLA
I. M. ROSS
F. M. SMITS

BY H. W. Lockhart

ATTORNEY

United States Patent Office 3,045,129
Patented July 17, 1962

3,045,129
SEMICONDUCTOR TUNNEL DEVICE

Martin M. Atalla, Mountainside, Ian M. Ross, Summit, and Friedolf M. Smits, Berkeley Heights, N.J., assignors to Bell Telephone Laboratories, Incorporated, New York, N.Y., a corporation of New York

Filed Dec. 8, 1960, Ser. No. 74,662
6 Claims. (Cl. 307—88.5)

This invention relates to semiconductor devices and more particularly to devices commonly termed tunnel diodes.

A tunnel diode derives its name from the fact that in a semiconductor wafer including a PN junction between two degenerate regions, for appropriate values of forward bias, quantum-mechanical tunneling through the junction results in a negative resistance characteristic between connections to the two regions. N-type conductivity material is considered degenerate when the corresponding Fermi level is above the bottom of the conduction band and the material acts like a metal. Similarly, P-type conductivity material is considered degenerate when the corresponding Fermi level is below the top of the valence band.

One limitation on the usefulness of such a device is that it is a two-terminal device which makes it awkward to isolate an input branch from an output branch when such a device is included in a circuit arrangement.

Another limitation on the usefulness of such a device is that it is difficult to modulate the negative resistance.

The present invention is directed at a three-terminal device which overcomes one or more of these limitations.

A feature of the present invention is a semiconductor wafer including a PN junction separating a degenerate region of one conductivity type and a nondegenerate region of the opposite conductivity type, in combination with means including a third connection for inducing contiguous the degenerate region a second degenerate region of the opposite conductivity type to form a junction which exhibits the tunnel effect.

In the basic form of this invention, an electrostatic field is established across a dielectric film which is in contact with the surface of a semiconductor wafer. The wafer includes a degenerate and a nondegenerate region defining a PN junction which extends into the wafer from this surface. In response to the field, an induced charge region is established at the surface of the semiconductor wafer contiguous the degenerate region. Quantum-mechanical tunneling occurs between this induced charge region and the degenerate region in response to an appropriate bias.

The objects and features of this invention will become apparent during the detailed description rendered in relation to the drawing, wherein.

It is to be understood that the figures are for illustrative purposes only and, therefore, not necessarily to scale.

Figure 1:
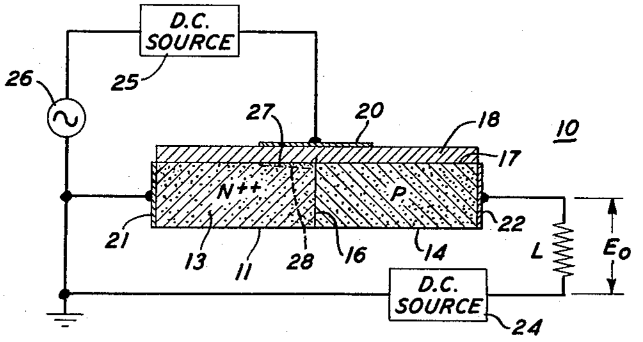
FIG. 1 is a cross-sectional view of an embodiment of this invention.

With reference now, more specifically, to FIG. 1 of the drawing, the semiconductor device 10 includes a semiconductor wafer 11, typically of monocrystalline silicon. The wafer includes two regions 13 and 14 of $N^{++}$ and P conductivity type, respectively, the $N^{++}$ symbol designating an impurity concentration sufficiently high to produce N-type degeneracy. Regions 13 and 14 define the PN junction 16 which intersects surface 17 of wafer 11. An oxide coating 18 covers the surface 17 of wafer 11, an electrode 20 overlies the oxide coating 18 and substantially ohmic contacts 21 and 22 are connected to regions 13 and 14, respectively. A direct current source 24 and the load L are serially connected between contact 21 and contact 22. A second direct current source 25 and a signal source 26 are serially connected between contact 21 and electrode 20.

In one embodiment, the electrode 20 is centrally disposed with respect to and opposite the PN junction 16. Also, source 24 is poled to forward bias PN junction 16 and source 25 is poled to accumulate a negative charge on the electrode 20. At sufficiently high bias voltages applied by source 25 between contact 21 and electrode 20, the surface region 27 underlying the electrode 20 inverts to $P^{++}$ and tunneling occurs across the PN junction 28 formed between this surface region and the contiguous $N^{++}$ region 13. The PN junction 28, or more exactly its depletion layer, is sufficiently thin as to permit significant amounts of quantum-mechanical tunneling. Typically, the junction should be about 100 Angstrom units thick. In response to a signal from signal source 26, the device exhibits an output characteristic which depends upon the tunneling of majority carriers between the degenerate regions.

Figure 2A:
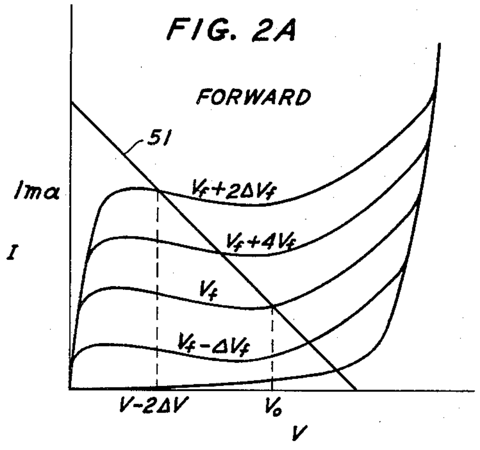
FIGS. 2A and 2B are graphs depicting the operation of the embodiment of FIG. 1.

The output characteristic for this device in its forward bias condition is represented in FIG. 2A as a family of constant $V_f$ curves plotted on an output current versus output voltage graph, where $V_f$ is the voltage applied between contact 21 and electrode 20. The characteristics are observed across load L. Each curve is characterized by a low positive impedance, a high impedance and, under certain circumstances only, a low negative impedance successively after which the curve follows the typical forward characteristic of a PN junction.

A variation in the input signal voltage from $V_f$ to $V_f+2\Delta V_f$ will produce a corresponding variation in output voltage from V to $V-2\Delta V$ as is seen from the intersection of the two appropriate $V_f$ curves and the load line 51. Accordingly, the device is useful as an amplifier.

Figure 2B:
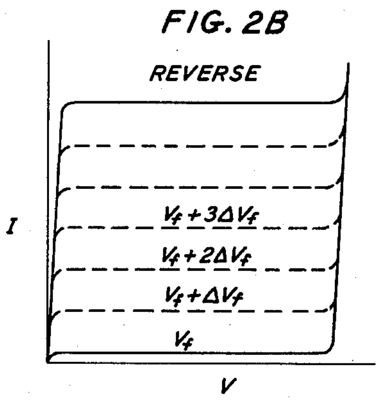

Alternatively, in the above embodiment, source 24 is poled to reverse bias PN junction 16. In this case, the surface portion of region 14 underlying electrode 20 becomes degenerate P-type material and it forms a junction with region 13 which exhibits the tunnel effect. In this reverse bias condition, each $V_f$ curve as illustrated in FIG. 2B is characterized by a portion over which the output current remains substantially constant for relatively large variations in output voltage.

Other embodiments are achieved by displacing the electrode to the oxide coating laterally from its centrally disposed position opposite the PN junction. The function of a particular embodiment depends on the specific position of the electrode relative to the degenerate region and the polarity of the voltage across the PN junction. For example, the electrode 20 of FIG. 1 is connected to the oxide coating centrally disposed with respect to and opposite the PN junction 16 or, alternatively, laterally displaced to one side of the junction. The operation of the device remains unchanged except for the voltage and current values involved.

Figure 3:
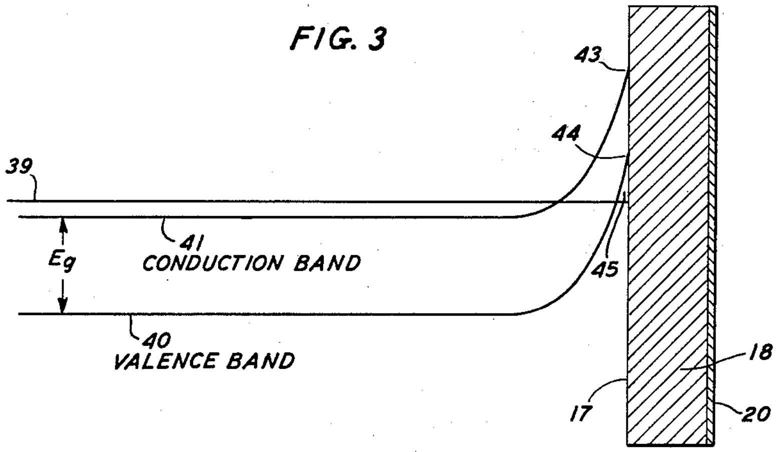
FIG. 3 is a schematic representation of the energy band structure of the device of FIG. 1.

The operation of the device of FIG. 1 can be explained in terms of the energy band picture of the semiconductor wafer shown in FIG. 3. The oxide coating 18 of the device of FIG. 1 is pictured at the right of FIG. 3 separating the wafer surface 17 and the electrode 20. Initially, the Fermi level 39 is drawn in the conduction band to correspond to the $N^{++}$ doping level of the region 13. Line 40 represents the top of the valance band and line 41 represents the bottom of the conduction band. The two lines are separated by an energy $E_g$ which corresponds to the forbidden gap for the semiconductor material.

The application of a bias from source 25 poled to accumulate a negative charge at the electrode 20 causes the energy bands to bend at the surface upwards from the initial horizontal position (equilibrium condition) to a position represented by points 43 and 44. As a result, holes are available for conduction as represented by area 45. The voltage required, at which this condition occurs, is primarily determined by the thickness of the dielectric material. In order to bend the energy bands to the point where a degenerate P-type surface layer is induced, an electrical field is induced in the surface of the semiconductor which for silicon exceeds a critical field of typically $10^6$ volts per centimeter for which the tunneling current becomes significant. In general, the voltage applied between the control electrode and the semiconductor body resulting in a field E is approximated by $$V_f \approx E \cdot W \frac{E_{SC}}{E_{DE}}$$

where W is the thickness of the dielectric film and $E_{DE}$ and $E_{SC}$ are the dielectric constants of the dielectric and the semiconductor, respectively. This relation is only approximate, since it neglects the voltage by which the band edges are bent.

The induced $P^{++}$ type region is in substantially ohmic electrical contact with the P-type region 14. If one applies, under such a condition, a positive voltage to the P region, a tunnel current can flow from the $N^{++}$ region to the induced $P^{++}$ region contiguous the dielectric. This current is modulated by a signal from signal source 26.

In an alternative electrical connection, the direct current voltage source 25 instead of being connected to the contact 21 is connected to the contact 22. The conditions in this case are the same for the case of no bias between contacts 21 and 22. A forward bias voltage between these contacts is now subtracted from the voltage applied by source 25. This results in a reduction of the tunneling probability between the $N^{++}$ region and the induced $P^{++}$ region resulting in a negative resistance characteristic. For this effect to be pronounced, however, it is necessary that the voltage from source 25 be comparable to the forward bias applied by direct current source 24. This requires that the thickness of the dielectric film be reduced so as to produce strong fields with a small voltage across the dielectric.

The tunnel current will flow along the surface through the induced $P^{++}$ layer to the P-type region. This current will cause resistive voltage drops in the induced region, resulting in a reduced bias with increasing distance from the P-type region. This has the effect that the parts of the induced region which are further removed from the P region do not contribute to the observed current. It is advantageous, therefore, to restrict the electrode to the dielectric to an area opposite the active region.

It is clear that the device will also work with all P regions replaced by N regions, N regions correspondingly replaced by P regions and all voltage polarities reversed. Advantages also are obtained by reversing only the polarity of the voltage applied by direct current source 24.

A device in accordance with this invention was fabricated as follows: Using a crystal puller, 50 grams of pure silicon was placed together with 3.7 milligrams of pure boron into a quartz-lined carbon crucible. This mixture was heated to growing temperature and an <111> etched silicon seed was used to grow approximately 25 grams of single crystal silicon, after which the crystal was pulled quickly away from the melt. A P-type crystal having a resistivity of .01 ohm-centimeter or an impurity concentration of about $10^{19}$ atoms per centimeter resulted. Using a new quartz liner, the crucible was recharged with 50 grams of pure silicon. The recharged crucible of silicon was heated to approximately growing temperature, after which 15 milligrams of arsenic was added. The above 25-gram single crystal of silicon was etched in "CP 8." The crystal acting as a seed was lowered into the melt and further material was pulled thus forming a PN junction, the N-type region having a resistivity of .03 ohm-centimeter or an impurity concentration of less than $10^{19}$ atoms per centimeter. The above techniques for growing semiconductor crystals including PN junctions are well known in the art and are disclosed in detail in Patent 2,631,356, issued March 17, 1953, to M. Sparks and G. K. Teal.

The crystal was cut into bars, .015 x .020 x 1 inch, each including a PN junction. These bars were etched in an etching solution containing by volume one part forty-eight percent hydrofluoric acid solution and ten parts seventy percent nitric acid solution to remove .003 inch from all surfaces. Following this, they were boiled in de-ionzed water in quartz beakers for ten minutes, then boiled for fifteen minutes in hydrofluoric acid solution, followed by three separate boilings in de-ionized water and then dried in a pure oxygen atmosphere. Subsequently, the samples were placed in a pressure bomb and oxidized at 650 degrees centigrade and 120 atmospheres of steam for twenty-five minutes, to produce on all surfaces an oxide coating of 1,000 to 2,000 Angstrom units thickness as described in Patent 2,930,722, issued March 29, 1960, to J. R. Ligenza. Thereafter, the samples were next dipped in a dilute solution of polystyrene, which coated them with at least 1,000 Angstrom units of polystyrene film. A layer of conductive Aquadag, which is a commercially available suspension of graphite powder in water, .015 inch long and covering the width of the sample was placed over the junction. Finally, by breaking through the dielectric film, substantially ohmic contacts were made to opposite ends of the bar. With no voltage applied between the electrode to the Aquadag and the contact to the degenerate conductivity region, the V-I characteristics between the contacts to opposite ends of the bar were typical for a good silicon diode, with a breakdown voltage of 40 volts. With, for example, 100 volts applied to the dielectric, the V-I characteristics were modified as expected; in particular, significant forward current was observed at voltages below .7 volt, at which voltage the injection current or normal diode current is negligible. The current observed in the control electrode was two to three orders of magnitude ($10^2$ to $10^3$) lower than this tunnel current.

No effort has been made to describe all possible embodiments of the invention. It should be understood that the embodiments described are merely illustrative of the various forms of the invention and various modifications may be made therein without departing from the scope and spirit of this invention.

What is claimed is:

1. In combination, a semiconductor wafer including first and second regions of opposite conductivity type defining a PN junction extending inwardly from a major surface of said wafer, in the absence of applied electric fields said first region being degenerate and said second region being nondegenerate, a dielectric film overlying said major surface, an electrode overlying said dielectric film, a separate low resistance connection to each of said two regions, an output circuit including a voltage source connected between said electrode and one of said low resistance connections for inducing in a surface portion of the wafer underlying said electrode charge carriers for forming thereof a degenerate region of conductivity type opposite that of said first region for forming a PN junction which exhibits quantum-mechanical tunneling, and an output circuit including a voltage source and a load connected between said two connections.

2. A combination in accordance with claim 1 wherein said electrode is centrally disposed with respect to and opposite said PN junction.

3. A combination in accordance with claim 1 wherein said electrode is laterally displaced from its central position opposite said PN junction.

4. In combination, a semiconductor wafer including first and second regions of opposite conductivity type defining a PN junction extending inwardly from a major surface of said wafer, in the absence of applied electric fields said first region being degenerate and said second region being nondegenerate, an oxide coating overlying said major surface, an electrode overlying said oxide coating, a separate low resistance connection to each of said two regions, an output circuit including a voltage source connected between said electrode and one of said low resistance connections for inducing in a surface portion of the wafer underlying said electrode charge carriers for forming thereof a degenerate region of conductivity type opposite that of said first region for forming a PN junction which exhibits quantum-mechanical tunneling, and an output circuit including a voltage source and a load connected between said two connections.

5. A combination in accordance with claim 4 wherein said electrode is centrally disposed with respect to and opposite said PN junction.

6. A combination in accordance with claim 5 wherein said electrode is laterally displaced from its central position opposite said PN junction.

No references cited.